United States Patent [19]

Issartel

[11] Patent Number: 5,245,734
[45] Date of Patent: Sep. 21, 1993

[54] MULTILAYER PIEZOELECTRIC ACTUATOR STACK AND METHOD FOR ITS MANUFACTURE

[75] Inventor: Jean-Paul Issartel, Annemasse, France

[73] Assignee: Battelle Memorial Institute, Carouge, Switzerland

[21] Appl. No.: 603,432

[22] Filed: Oct. 26, 1990

[30] Foreign Application Priority Data

Nov. 14, 1989 [EP] European Pat. Off. ........ 89810871.7

[51] Int. Cl.⁵ .................... H04R 17/00; H01L 41/08
[52] U.S. Cl. .................. 29/25.35; 310/328; 310/358; 310/363; 310/364; 310/366
[58] Field of Search .................. 310/357–359, 310/328, 366, 363, 364, 311; 29/25.35

[56] References Cited

U.S. PATENT DOCUMENTS

| 4,523,121 | 6/1985 | Takahashi et al. | 310/364 X |
| 4,978,881 | 12/1990 | Wakita et al. | 310/364 X |

FOREIGN PATENT DOCUMENTS

| 3223801 | 12/1983 | Fed. Rep. of Germany | 310/363 |
| 3330538 | 3/1985 | Fed. Rep. of Germany | 310/366 |
| 0058308 | 5/1981 | Japan | 29/25.35 |
| 0176282 | 9/1985 | Japan | 310/366 |
| 0229380 | 11/1985 | Japan | 310/366 |
| 3434729 | 4/1986 | Japan | 310/366 |
| 0097877 | 5/1986 | Japan | 310/366 |
| 61-142780 | 6/1986 | Japan | 310/364 |
| 0159777 | 7/1986 | Japan | 310/366 |
| 0276887 | 12/1987 | Japan | 29/25.35 |
| 0277780 | 12/1987 | Japan | 29/25.35 |
| 0081374 | 3/1989 | Japan | 29/25.35 |
| 0208879 | 8/1989 | Japan | 29/25.35 |
| 0284484 | 11/1990 | Japan | 29/25.35 |
| 0087076 | 4/1991 | Japan | 29/25.35 |

*Primary Examiner*—Mark O. Budd
*Attorney, Agent, or Firm*—Cushman, Darby & Cushman

[57] ABSTRACT

Multilayer piezoactuators are made by stacking and pressing alternating layers of piezoceramic material and interdigital electrode material. The electrode structure is provided with pressure protected boundary discontinuities which form areas in which electrodes edges do not make contact with the common electrical collectors of the piezoactuators and in which the piezoceramic layers are prevented from touching one another.

6 Claims, 2 Drawing Sheets

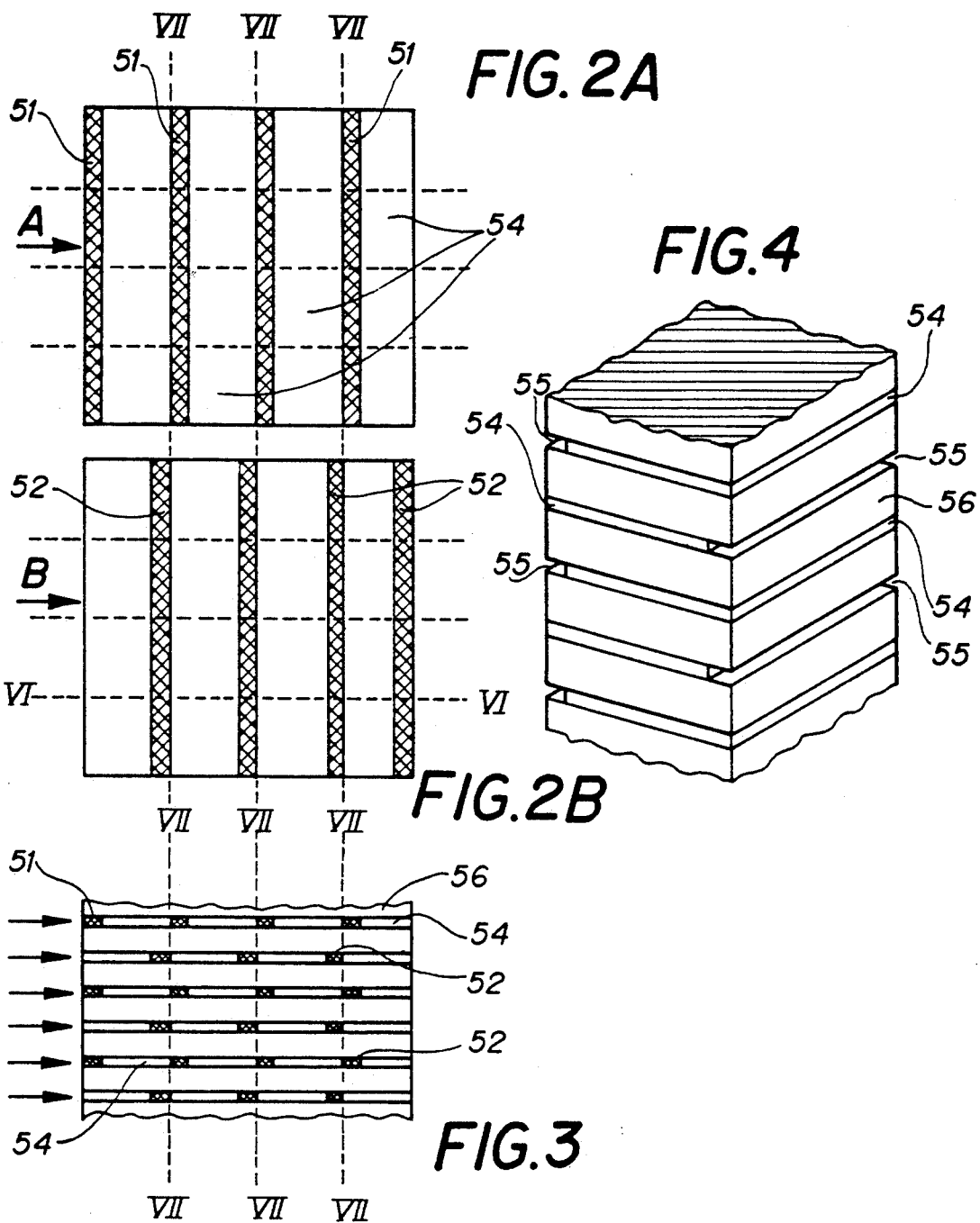

MULTILAYER PIEZOELECTRIC ACTUATOR STACK AND METHOD FOR ITS MANUFACTURE

The present invention concerns piezoelectric actuators using piezoceramics, more especially of the multilayer stacked type normally made by pressing and sintering laminates of alternately layered ceramic tiles and electrode layers. The invention also concerns methods for manufacturing such actuator stacks.

Ceramic materials can be described by a rigid ion model: anions and cations are connected by springs forming a crystal lattice. When an electric field is applied to the crystal, the cations are attracted in the direction of the field and the anions in the opposite direction. This force generates lattice deformation.

The ionic shift differences in noncentrosymmetric ceramics originate from soft and hard springs, producing piezostriction. The induced strain defined by the ratio of incremental deformation $\Delta L$ over the original length ($\Delta L/L$) is proportional to the applied electric field (i.e. $x = dE$). On the other hand, anharmonicity of the springs is essential, resulting in a second-ordered electrostriction effect. The strain induced is proportional to the square of the electric field ($x = E^2$).

Recent interest in piezoelectric/electrostrictive actuators has come from the development of new materials. Conventionally, piezoelectric ceramics have been used for vibrators such as buzzers, speakers, and ultrasonic generators, i.e. only for electronic components. However, for actuator applications, large electric fields, 1 kV/mm in magnitude, are applied to the material, thereby generating large stresses and strains. Therefore, electrical insulation strength and mechanical toughness are necessary material characteristics, as is adequate electrostriction.

Piezoelectric actuator materials are based primarily on lead zirconate titanate (PZT). These soft ferroelectrics exhibit an almost linear relation between strain and applied field below 100 V/mm, but for larger fields there is a non-negligible hysteresis during the rise and fall of the field. This hysteresis sometimes causes difficulty in servo-displacement control.

The newly developed materials that are electrostrictive are lead magnesium niobate (PMN) based ceramics. Generally electrostriction, a second-ordered phenomenon of electromechanical coupling, has been considered a small, negligible effect and has not been studied from a practical point of view. On the other hand, the PMN ceramics reveal huge strains up to 0.1% (i.e. a 1 cm sample can elongate by 10 $\mu$m) without hysterisis. Hence piezoelectric and electrorestrictive actuators manufactured with new ceramic materials offer many advantages some of which are listed below:
1) control in the displacement range up to several tens of micrometers with a high accuracy ($\pm 0.01$ $\mu$m)
2) high response speed ($\approx 10$ $\mu$s)
3) high generative force ($\approx 400$ kgf/cm$^2$)
4) driving power only one order of magnitude smaller than electromagnetic motors (because of capacitive losses).

Recent preparation technology of ultrafine ceramics has been very useful in preparing reliable and durable ceramic actuators. Hydration of metal-alkoxides, coprecipitation of hydroxides from aqueous solutions, and spray drying methods etc. are used to prepare chemically homogeneous powder with uniform, small particles. The PLZT (9/65/35) has exhibited increasing mechanical fracture toughness with decreasing grain size, typically <1.8 $\mu$m in diameter.

Piezoelectric and electrostrictive actuators are useful in many industrial applications some of which are listed in the Table below.

| APPLICATIONS OF ELECTROSTRICTIVE ACTUATORS | | | |
| --- | --- | --- | --- |
| Strain | Driving Control | Application | Device |
| Rigid | Servo | Optical | 1 High-sensitive ac interferrometric dilatometer |
| Rigid | Servo | Optical | 2 Bistable optical device |
| Rigid | Servo | Optical | 3 Deformable mirror |
| Rigid | Servo | Optical | 4 Deformable optical grid |
| Rigid | Servo | Optical | 5 Microscope stage |
| Rigid | Servo | Mechanical | 6 Ultra-precision guide mechanism |
| Rigid | Servo | Mechanical | 7 Cutting-error compensation actuator |
| Rigid | Servo | Mechanical | 8 Oil-pressure servovalve |
| Rigid | Servo | Mechanical | 9 VTR head |
| Rigid | On/Off | Optical | 10 Swing CCD image sensor |
| Rigid | On/Off | Optical | 11 Micro-angle adjusting device |
| Rigid | On/Off | Mechanical | 12 Dot-matrix printer head |
| Rigid | On/Off | Mechanical | 13 Piezoelectric relay |
| Rigid | On/Off | Mechanical | 14 Ink Jet |
| Resonating | ac | Energy transfer | 15 Ultrasonic surgical knife |
| Resonating | ac | Energy transfer | 16 Piezoelectric fan |
| Resonating | ac | Energy transfer | 17 Ultrasonic humidifier |
| Resonating | ac | Energy transfer | 18 Piezoelectric pump |
| Resonating | ac | Optical/mechanical | 19 Ultrasonic motor |
| Resonating | ac | Optical/mechanical | 20 Ultrasonic linear motor |
| Resonating | ac | Optical/mechanical | 21 Moving micromechanism |

References about piezoelectric actuators include S. TAKAHASHI, "Longitudinal Mode Multilayer Piezoceramic Actuators" in Ceramic Bulletin 65 (1986), 1156-1157; S. TAKAHASHI et al, Ferroelectrics 50 (1983), 181-190; K. UCHINO, Ceramic Bulletin 65 (1986), 647-652.

Actuators of the multilayer stacked type generally consist of a prism-shaped laminate block of alternate piezoceramics tiles and electrode layers stacked over each other. Generally, this block has a square or rectangular base but it may also be circular. Each group of even and odd numbered electrodes, each of which is sandwiched between a couple of ceramic layers are connected to a current collector, generally and outer electrically conductive strip or layer applied on opposed side faces of the block perpendicular to the laminate. In order that the odd electrodes do not short with the even collector on the opposite side of the block, or vice-versa, the electrodes may be of the inter-digital staggered type (also called "Tab-Designed") in which the length of the electrodes in each group is limited to be less than the width of the block so that the tip of each electrode is separated from the collector of the opposite group by a discontinuity, i.e. a region between two ceramic layers which is electrostrictively or piezoelectrically inactive and in which the opposing surfaces of the couple of ceramic layers will touch and may cling together during sintering of the piezoactuator block or during operating thereof.

However, this kind of construction is impeded due to mechanical brittleness at the discontinuity of the staggered internal electrodes. When an electric field is applied, the interdigital electrode type develops tensile stresses large enough to generate cracks on the electrode plane around the boundary between electrostrictively nor piezoelectrically active and inactive parts.

One solution is the use of modified electrode patterns (so-called "plate through" electrodes) in eclipsed configuration to remove the electrostrictively inactive regions and eliminate the tensile stress. In this embodiment, the electrodes are not interrupted and cross-out through the block which removes the transversal physical constraints due to structure inhomogeneity. However, this construction does not remove longitudinal anisotropy (succession of plain ceramic and electrode layers) and further, the electrode tip in each group must be insulated individually not to interfere with the electric collector connected to the opposite group of electrodes, which requirement complicates the construction (see S. TAKAHASHI, New Materials & New Processes 3 (1985), 63–68). Another solution is to use ceramic electrodes instead of metal electrodes to improve mechanical toughness (K. UCHINO, "Essentials to Development and Applications of Piezoelectric Actuators", in Electronics Essential Series No. 3, Japanese Industrial Technology Center, Tokyo 1984). However ceramic electrodes are generally thicker than corresponding metal electrodes and the introduction of such a substantial amount of foreign material may interfere with the dynamic efficiency of the interlaid piezoceramic layers.

It has now been found that the foregoing drawbacks can be partly or totally eliminated by preventing the surfaces of two consecutive piezoceramic layers to come into mutual contact in the electrostrictively or piezoelectrically inactive regions. This can be achieved for instance at the electrode manufacturing stage by filling the space left after interrupting the electrode pattern with a material that will resist the pressure forces developed during pressing of the stack and also during piezoactuator operation. Furthermore, unproved overall rigidity may be assured, if desired, by providing local discontinuities or "holes" in the electrode surface, such discontinuities being filled with piezoceramic, e.g. the same piezoceramic that constitutes the actuator device itself.

Such aforementioned interruptions or discontinuities constitute sort of ceramic pillars or columns which locally bind together, across the intermediate electrode layer, one piezoceramic layer to the next and strongly reinforce the mechanical properties of the whole stack. Structures of this type are disclosed, for instance, in ISAF "86", Proceedings of the sixth IEEE International Symposium on Application of Ferroelectrics, 1986, p. 652–655; and GB-A-2,115,223.

The invention is disclosed in more detail with reference to the annexed drawing.

FIGS. 2A and FIG. 2B are schematic plan views of piezoceramic tile elements used in the fabrication of piezoactuators according to the invention.

FIG. 3 is a schematic vertical cross-section along line VI—VI of FIG. 2B of a stack of elements of the type represented in FIGS. 2A and 2B.

FIG. 4 is a schematic view in perspective of a nonterminated piezoactuator block as it results after cutting the stacked block of FIG. 3 along lines VI—VI and VII—VII.

Figure 1:
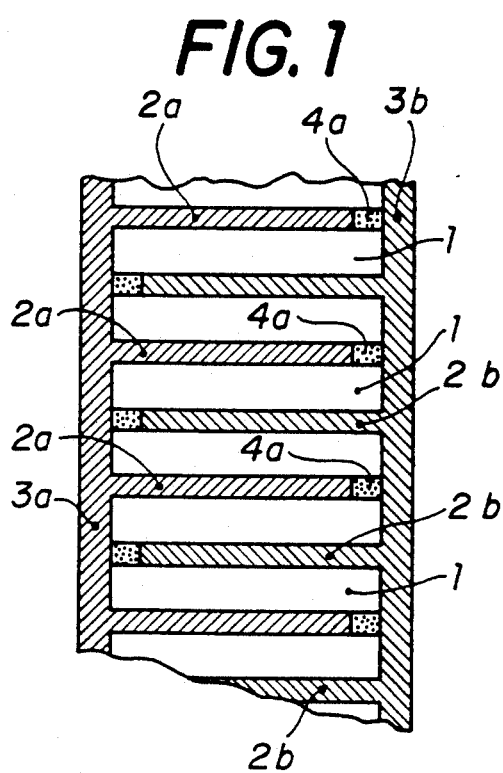
FIG. 1 is a schematic illustration of the principle of the invention with reference to a first embodiment.

The piezoactuator block, a portion of which is illustrated schematically in FIG. 1, comprises a plurality of stacked piezoceramic tiles or layers 1 and electrodes 2a and 2b inserted between the piezoceramic tiles 1. The electrodes are made of a refractory metal like platinum for instance, deposited by a printing process, or they can be made of cermet or porous piezoceramic infiltrated with a low-melting alloy. The electrodes 2a (even numbered electrodes) form a group (A) and are all connected to a collector electrode 3a on one side of the actuator block. The electrodes 2b (odd numbered electrodes) form another group (B) and are connected to another current collector 3b on the opposite face of the block. It can be seen on the drawing that the electrodes do not extend across the full width of the block; the even numbered electrodes 2a, for instance, extend to only a fraction of the width of the block, thus leaving a space 4a not subjected to the electric field generated by the electrodes. This space forms a gap between two consecutive piezoceramic tiles. In the piezoactuators of the prior art, this gap disappears during construction, i.e. when the laminate block is pressed and fired for sintering, the still plastic piezoceramic material is constrained and will fill said gap, so that said consecutive tiles become jointed by mutual blending in this area. This is a cause of electromechanical unbalance and generates internal stresses in the structure. In the present invention the gap is filled with a material which resists pressure during pressing of the block so that the two straddling tiles will not blend together in sintering. Preferably the material in space 4a is somewhat resilient to compensate for the mechanical unbalances generated under operation in this electrostrictively or piezoelectrically inactive region. A convenient material is a thermally resistant organic resin such as an epoxy-resin, a perfluorinated polyakylene resin, or a polyimide resin.

FIGS. 2A, 2B, 3 and 4 illustrate a method to manufacture a piezoactuator block according to the invention.

FIGS. 2A and 2B show schematically from above two successive elements or layers A and B of piezoceramic 56 to be stacked with other similar layers in actuator manufacture. FIG. 3 shows in cross-section (line VI—VI of FIG. 2B) a portion of the actual stack achieved by piling successive pairs of layers A and B. Elements A and B are tiles of piezoceramic in the plastic state obtained by tape-casting as will be described later and cut to size for stacking. After being stacked with their kins into a stack which is thereafter pressed to a block as described, the block is cut vertically along the dotted lines to provide individual smaller blocks of actuator format.

A fugitive pattern of silk-screened parallel stripes 51 is provided on sheet A and a pattern of stripes 52 is provided on sheet B. The stripes can be about 10-150

μm wide and a few μm or a few tens of μm high, i.e. about the height of the electrode structure 54 between the stripes. The electrode structure here can be screen-printed with a Pt compound, or it can be a conductive cermet, or it can be a ceramic in admixture with a fugitive material to be destroyed by firing and providing a porosity to be later infiltrated with a low melting allow. This will be described later in this application.

It can be seen from FIGS. 2A and 2B that the positions of the stripes 51 and 52 are offset relative to the dotted cutting lines, i.e. stripes 51 are to the left of the lines and stripes 52 are to the right. Hence after piling up the successive A and B elements, pressing and firing to effect compaction and burning of fugitive paint, then finally cutting the block to actual actuator size as shown schematically in FIG. 4, the departed stripes will leave empty side grooves 55 in staggered configuration on opposite sides of the preformed actuator. These grooves correspond to gaps 4a discussed in connection with the embodiment of FIG. 1. In the drawing, reference numeral 56 designates the piezoceramic tiles. The depth of the grooves is considerably exaggerated in the drawing for illustration convenience. The actual depth is only a few μm to a few tens or hundreds of μm, i.e. a value corresponding to the width of original stripes 51 and 52.

During actuator termination, the grooves are filled with insulating material, for instance a high temperature resin like a polyimide resin; alternatively the insulator can be mineral. The advantage of this manufacturing embodiment over the prior art using "plate-through" electrodes which require edge-insulation by means of glass strips applied over the electrodes edges on the side faces of the activator block relates to positioning accuracy and efficiency. It is obviously much more difficult to position insulator fillets on a flat surface without guiding marks than simply filling depressed areas in this surface. Moreover, after insulation, the block side surface is flat (while it is corrugated in the prior art) which facilitates final application of collector electrodes.

Figure 5:
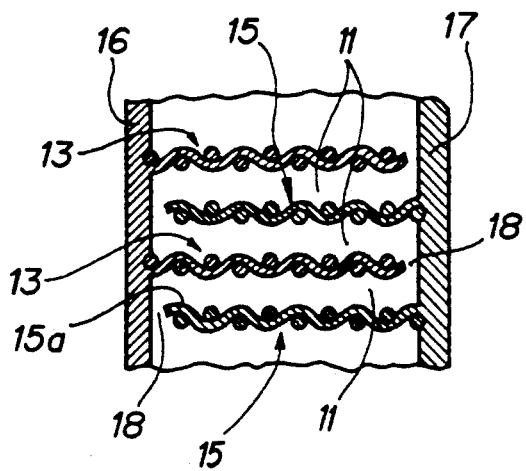
FIG. 5 is a schematic cross-section of an embodiment of actuator block

FIG. 5 is a schematic cross-section of a portion of a piezoceramic actuator according to another embodiment of the invention. FIG. 5 shows a plurality of piezoceramic layers or tiles 11 separated by electrodes 13 and 15 embedded in the ceramic. The electrodes are made of a very fine metal wire grid, for instance 5–50 μm gauge. The electrodes on FIG. 5 are schematized by showing the weft filaments in cross-section and reference numeral 15a designates a warp filament of the electrode. Even numbered electrodes 13 form a group the members of which are connected to a collector electrode 16 and the odd numbered electrodes 15 form another group connected to another collector electrode 17 on the opposite side face of the stack block. It is noted that the position of electrodes 13 and 15 alternate in the stack, i.e. one electrode 13 of a group is followed by an electrode 15 of the other group and so forth.

In this staggered configuration each electrode in a group terminates at a distance 18 from the collector of the other group of electrodes to prevent the collectors to become shorted. This interruption 18 forms a gap between consecutive piezoceramic tiles in which a material which may compensate and equilibrate the internal stress due to expansion unbalances in operation of the piezoactuator has been inserted. This material can be mineral or organic and preferably has a degree of resiliency.

The metal of the wire mesh can be a refractory metal for instance platinum in case the stack is made by interlaying the wire-mesh electrodes and the piezoceramic layers in green plastic form and thereafter pressing the stack and firing. In case the electrodes are achieved by infiltration, i.e. fugitive electrodes of a consumable material are used, this material is destroyed upon firing, and the resulting voids are thereafter infiltrated with metal; in this case the metal of the electrode can be a low melting metal, e.g. tin, lead or silver and alloys thereof. Manufacturing details are provided later in this specification.

Figure 6:
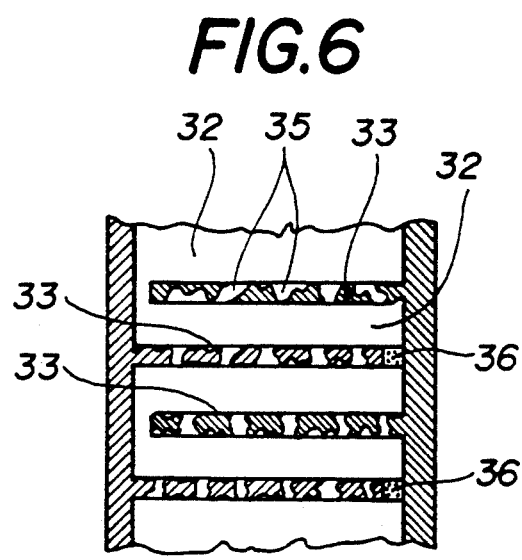
FIG. 6 is a schematic cross-sectional view of a variant.

FIG. 6 shows schematically another embodiment of the actuator of the invention. Here, the electrodes 33 which separate the successive piezoceramic layers 32 are made of metal infiltrated in a porous structure layer with open porosity. This is achieved in manufacture by use of what is defined as "fugitive" materials, i.e. by inserting between the piezoceramic tiles layers containing a proportion of pyrolyzable material, e.g. organic binders (see the aforementioned IEEE reference) or carbon particles which, upon firing, will burn out and provide the desired open porous structure which is thereafter infiltrated with metal. The size and proportion of the carbon particles in the ceramic can be adapted so that their removal leaves a proportion of ceramic "bridges" 35 sufficient to provide a trussing effect in the laminate. In this connection, the average size of the carbon particles (or any other consumable material) will roughly correspond to the electrode thickness and their proportion in the ceramic of the fugitive electrode will be sufficient to ensure electrical continuity over the full body thereof. Alternatively smaller carbon particles can be used.

In the embodiment of FIG. 6, each electrode layer terminates with a "gap" 36 filled with a material of sufficient density not to collapse under pressure at the time the actuator block is manufactured by pressing the laminate made of layers 32 and 33. The manufacturing details will now been discussed.

Indeed, the present invention also deals with the methods for obtaining the present actuator structures. Two main routes can be followed. In a first route, the electrode material directly provides the electrode metal upon firing, so it can either be the metal itself or a precursor. The metal itself must resist high temperature oxidation, hence it must be refractory like an Ag-Pd alloy, platinum or other precious metals. Otherwise a silk-screen conductive ink can be used which will partially decompose upon firing. This particularly suits the embodiment of FIG. 1 in which a coating in the form of an electrode pattern, e.g. a grate pattern is screen printed over each layer of piezoceramic, a boundary region designed to provide a non-conductive area being coated with fugitive pressure resisting material; then the layers (in green form) are stacked, pressed and the resulting laminate block is sintered. During pressing the ceramic fills the voids between the uncoated areas, except in the borderline regions with the fugitive material which, after being burned, will leave empty "gaps" to be eventually filled with piezo-inactive material.

In a second route, the method involves establishing first fugitive electrode patterns, i.e. layers containing a heat decomposable material which, upon firing, will leave voids which can thereafter be filled with metal. Embodiments of FIGS. 5 and 6 are particularly adapted to this technique in which for instance pyrolyzable polymer fabrics or carbon powders are involved. It should be noted that in the present invention, each element of the original stack (tile or leaf) can be considered an element of one or of a plurality of actuators, i.e. in this latter case the stacked block is ultimately divided (at the green or sintered stage) by cutting the block transversally to the laminate into actuator blocks whose cross-sectional area is a fraction of that of the original block.

For instance, for bringing about the embodiment of FIG. 5 whereby an electrode interruption 18 to be ultimately filled with inert material is contemplated, pieces of nylon or polyester monofilament fabric (20–30 μm filaments) can be embedded between layers of piezoceramic. This can be performed very simply as follows: a layer of piezoceramic paste is deposited on a tape by the tape-casting technique and thereafter, before drying, a nylon fabric strip slightly narrower than the tape and impregnated with the ceramic slurry is applied thereto as a coating in correct registration to leave a thin uncoated bare track on the tape side, this track being coated with a fugitive material, e.g. a carbon powder slurry. The assembly is laminated (for instance between heated plates) and dried to plastic consistency. Then the ceramic with nylon fabric embedded therein is cut into leaves of proper size for stacking (a fraction of cm$^2$ to several cm$^2$) and the leaves are piled together in alternate fashion, i.e. orienting the carbon coated side of the even numbered leaves opposite the corresponding side of the odd numbered leaves. Then the stack is pressed to ensure full homogeneity and integrity of the ceramic from top to bottom and then it is sintered in air under usual conditions. During this treatment, the nylon mesh as well as the carbon coated side strip are burned leaving corresponding voids in the ceramic, i.e. a porous structure and alternating empty grooves on the sides. The grooves are then filled with an inert material, either temporary (resist) or final (high temperature organic or mineral filler). Resists are defined as filling materials designed to resist during infiltration of the porous structure by molten metals and can be easily removed afterwards, for instance by dissolution or brushing. Resists will include UV curable organic resins and water soluble minerals applicable in the molten or dissolved state like halogenide, phosphate and sulfate salts or pulverulent minerals like clays, talc, bentonite, attapulgite and the like.

The porous structures are thereafter infiltrated with molten metal (or a metal derivative in liquid form which thereafter decomposes to the metal) by usual means conventional in the field of ceramic capacitors (see for instance GB-A-2,103,422; U.S. Pat. No. 3,679,950). Finally an electrode collector material is applied on the sides of the stack, for instance in the form of an electrically conductive paint or ink, e.g. a silver based ink (see the foregoing references).

In the embodiment of FIG. 6, two tapes (A) and (B) of equal width are used. A layer of pure piezoceramic is cast on the full width of tape (A) and a narrower layer of a mixture of piezoceramic and carbon powder is cast on tape (B), the free space on the tape side being coated with a fugitive material, e.g. carbon slurry. Then before complete drying, tapes (A) and (B) are assembled over each other in overturned fashion so that both castings are laminated together, the supporting tapes remaining on the outside and being detachable after drying. In applying the two castings over each other, the same kind of registration as before is observed, i.e. the ceramic portions are flush on one edge side while on the other edge side, the edge of the fugitive stripe of casting (B) is flush with the edge the wider casting (A) of pure ceramic. The remaining steps are as disclosed above, i.e. the laminate is cut to size into leaflets or tiles which are stacked in alternate fashion; then the structure is pressed and fired to consolidate and burn out the carbon particles, thus providing a block structure in which the piezoceramic tiles alternate with porous ceramic layers an edge of which forms the bottom of grooves in the sides of the block like pictured in FIG. 4. The grooves are filled with inert, preferably resilient, material, the porous layers are infiltrated with metal as usual and the block is terminated by applying the two collector electrodes and connector terminals.

It should be pointed out that if in this embodiment the infiltrable porous electrode structure is replaced by a cermet powder of refractory metal resisting oxidation under firing conditions, e.g. Ag-Pd alloy or Pt, an actuator of comparable properties is obtained, the structure of the resulting cermet electrode layers being functionally similar to that of the infiltrated layers since the differences only refer to the replacement of the infiltrated low melting metal by particles of the refractory metal. Hence in this variant, infiltration is omitted.

Regarding the problem of individually insulating the tip of electrodes in the construction of actuators with electrodes of the "plate-through" type, it should be recognised that the manufacturing techniques typically used in this invention may strongly simplify the problems of accurately placing, on the actuator sides, the additional insulative strip to cover the bare end of those electrodes to be insulated.

The following practical examples illustrate the invention.

EXAMPLE 1

In this Example reference if made to FIGS. 2A, 2B, 3 and 4. Three different slurry compositions were used here: a first piezoceramic slurry (A) was prepared by milling for 24 hrs the following ingredients with a load of zirconia balls:

| | |
|---|---|
| Piezoelectric powder PZT 5H, Vernitron Ltd. | 100 g |
| Binder (polyvinylbutyral) | 14 g |
| Plasticizer (polyethylene glycol) | 5 g |
| Plasticizer (dioctylphthalate) | 3 g |
| Organic defloculant agent (triethyl phosphate) | 1 g |
| Solvent (1:1 mixture of trichloroethylene and ethanol) | 75 g |

A second slurry (B) was prepared as above but replacing the piezoelectric powder by carbon powder (No. 1004, Carbone Lorraine, average size 30 μm).

Then a third slurry (C) was made also as above but replacing 40% by weight of the piezoceramic powder by a very fine powder (about 1 μm average particle size) of a refractory metal alloy (Ag/Pd 30/70). This composition was milled extensively in order to reduce the size of all particles to an average range of about 1 μm.

After removing the milling balls, the thick slurry (A) was cast into an approximately 150 μm thick layer (doctor's blade) on a 30 mm wide MYLAR tape (Du Pont). The casting was dried in air and, when flexible, was removed from the supporting tape. The plastic casting was cut into 30×30 mm square sheets or tiles.

Then, on 30 of such sheets a pattern A of stripes 51 (see FIG. 2A) was applied by silk-screening. The stripes were 500 μm wide, 5 μm high and 6 mm apart. The stripes were made with the second slurry (B) containing carbon particles. Now, a pattern B according to FIG. 2B was applied to a second series of 30 sheets of piezoceramic and the intermediate areas 54 between the stripes were screen-coated with the third slurry (C) of permanent electrically conductive material. This concerns the sheets A and B, i.e. the sheets with patterns, respectively A and B. (It should be noted that patterns A and B could also be roll-printed on the original casting before removing from the tape and cutting to size).

Then after drying the prints, a stack was made by piling up a plurality of sheets A and B in alternating order. The stack was hot-pressed (20 MPa, 80° C.), burned and sintered as follows:

The monolithic stack was placed in a pyrolysis oven and slowly heated to 800° C. (5° C./hr). After cooling, it was placed in a sintering oven also containing a supply (pressed disks) of a mixture of lead and zirconium oxides and sintered for 2 hrs at 1300° C. At this temperature, the pellets of lead and zirconium oxide evaporate partially and the vapors compensate for possible losses of the piezoceramic during sintering. The foregoing operations produced a monolithic square-sectional block (about 25 mm aside because of contraction during sintering) in which the carbon of the original stripes has burned away and left open channels around conductive cermet areas 54 embedded in the block. Then the block was cut into actuator format shown in FIG. 4 by sawing (diamond saw) along the dashed lines VI and VII (see FIGS. 2A, 2B and 3), and the staggered grooves 55 on the narrower cut blocks were level filled with high temperature polyimide resin to insulate the resulting cermet electrode plates and prevent them from clinging in operation. After curing the resin, the block sides were sanded to clean the edge of the non-insulated electrodes and conductive paint was applied to achieve the side collector electrodes, one collector for connecting with the odd-numbered electrodes and another collector for the even-numbered electrodes. Then the actuator was completed by soldering electric terminals to the collectors and finally sealed in a resin. After usual polarization for conditioning, the actuator was subjected to rests which demonstrated superior performances and service life.

EXAMPLE 2

The following blend was prepared and milled for 24 hrs with a load of zirconia balls:

| | |
|---|---|
| Piezoelectric powder PZT 5H, Vernitron Ltd. | 100 g |
| Binder (polyvinylbutyral) | 14 g |
| Plasticizer (polyethylene glycol) | 5 g |
| Plasticizer (dioctylphthalate) | 3 g |
| Organic defloculant agent (triethyl phosphate) | 1 g |
| Solvent (1:1 mixture of trichloroethylene and ethanol) | 75 g |

After removing the milling balls, the thick slurry was cast into a 400 μm thick layer (doctor's blade) on a 300 mm wide MYLAR tape (Du Pont). The casting was dried in air and, when flexible, was removed from the supporting tape. The plastic casting was cut into 10×10 mm squares on which a pattern was screen printed using a carbon-based paint (type 1116-S from Electro-Science Laboratories Inc.). The general pattern was that of a 50 mesh screen, i.e. having cross-lines 50 μm wide (and up to 20 μm high) separated by 50 μm. On one side, the pattern was terminated by a 500 μm wide stripe.

The prints were dried and the squares were stacked (60 units) in a mould, with the stripe side alternatingly inverted right and left. Pressure was applied (20 MPa, 80° C.) to form a monolithic block. In this operation, the plastic ceramic flows into the pattern meshes and integrally binds together the piezoceramic layers, i.e. embeds the screen patterns in the body thereof.

Then the monolithic stack was placed in a pyrolysis oven and slowly heated to 800° C. (5° C./hr). After cooling, it was placed in a sintering oven also containing a supply (pressed disks) of a mixture of lead and zirconium oxides and sintered for 2 hrs at 1300° C. At this temperature, the pellets of lead and zirconium oxide evaporate partially and the vapors compensate for possible losses of the piezoceramic during sintering.

After pyrolysis and sintering the stacked block of monolithic piezoceramics comprises a succession of layers of piezoceramic tiles and, between them, a pattern of the original printed screen in the form of a grid of empty channels. Each grid is edged by a 500 μm deep groove, these being alternately arranged on both sides of the block. These grooves were temporarily filled by applying a not concentrated aqueous $K_2CO_3$ solution and rapid drying in air at 500°-800° C.

The sintered block was thereafter placed in an enclosure above a pot of molten alloy at 850° C. The alloy was of Ag 68.4%-Cu 26.6%-Pd 5%. The block was first placed under vacuum (40 mbar) to remove the residual atmosphere in the inner channels of the porous structure, then it was slowly immersed in the molten alloy and an inert gas pressure of 15 MPa was established for about 15-30 min whereby the molten metal was forced within the pores in the block. The metal was allowed to solidify under pressure after which the block was withdrawn from the enclosure, cooled and washed with water to remove the plugs of $K_2CO_3$ which were thereafter replaced by an epoxy resin.

Then both sides of the actuator were coated with a layer of a silver based paint to constitute two collector electrodes, one collector for connecting with the odd-numbered electrodes and another collector for the even-numbered electrodes. Finally the actuator was completed by soldering electric terminals to the collectors and finally sealed in a resin. After usual polarization for conditioning, the actuator was subjected to tests which demonstrated superior performances and services life.

EXAMPLE 3

In this Example, there were used a 30 mm wide casting tape similar to that used in Example 2 and a nylon monofilament fabric strip of same width. The nylon fabric was a 82 μm mesh gauge woven with 30 μm thick monofilaments. The strip and the tape were applied in registration against each other and a layer of the same slurry of piezoelectric PZT ceramic was cast over the strip supported by the tape.

After drying, the flexible composite casting (130 μm thick) containing the nylon fabric embedded in the lower part thereof was removed and cut into square leaves 30 mm aside.

The squares (60 units) were piled up in a mould and the resulting stack was pressed as described in the previous example to assure full cohesion of the layers together by forming ceramic "bridges" through the nylon fabric meshes.

Then the stack was fired and sintered as described in Example 1, whereby the fugitive nylon filaments volatilized leaving in the block a succession of inlaid layers of criss-crossing empty channels in the form of the original fabric pattern.

The monolithic block was thereafter infiltrated with a molten lead-silver (90/5) alloy at 310° C. using the same technique disclosed in Example 2 and finally cut transversally into actuator stacks of 5 mm side cross-sectional area. Each actuator was then constituted by a stack of 60 parallel metal electrodes embedded in the piezoceramic. Of these 60 electrodes, the even-numbered ones were to be connected to a first collector on a first side of the actuator and the odd-numbered electrodes had to be connected to a second current collector placed on the opposite side of the block. Hence the edge of the odd-numbered electrodes on the first collector's side has to be insulated individually not to become in contact with said first collector upon application of said first collector on the first side of the block. This insulation was provided by etching, i.e. by first applying, by the silk-screen technique (or by irradiation through a photo-mask) on the first side of the block, a resist layer which covers the surface except for the edge of the odd-numbered electrodes which are flush with the first side of the block. These uncoated areas were then etched to a depth of 100–200 μm with aqueous hydrofluoric acid. The same operation was carried out on the opposite side for the edges of the even-numbered electrodes. Resulting grooves were filled with a resilient high temperature polyimide resin (EPO-TEK 600, of Epoxy Technology Inc.). Polymerization was effected by heating for one hour at 150° C. then for half an hour at 275° C.

Then by usual means known from those skilled in the manufacture of electronic components, the resist layer was removed with solvent and external collector electrodes were formed on both sides of the block including the polyimide filled grooves using an electrically conductive curable paint, and terminal lead wires were soldered by means of an electrically conductive glue. Then the actuator was sealed into protective resin and conditioned by polarization. This embodiment also behaved very satisfactorily under testing. In a modification, the side grooves for insulating the electrode edges can also be dug with a diamond saw instead of etching.

It should be noted that according to a variant of this example, one can also use for instance a 10 mm wide tape and a 10 mm nylon strip with a 9 mm wide 50 μm mesh fabric centered on the tape to provide on both sides a 0.5 mm wide plain nylon margin. After casting and removing from the tape, the flexible structure can be slit axially and the obtained segments cut by a multiple of the length of an actuator side, say, into 30 mm lengths. These portions can be stacked in alternate fashion, i.e. each time reversing the position of the margin of the new segment relatively to that of the previous one. Then the assembly can be compacted, burned, sintered, the 0.5 mm grooves left after volatilization of the nylon margins protected with a heat resistant filler resist, infiltrated with molten metal and finally cut into actuator blocks in which each electrode terminates about 0.5 mm from the opposite side of the actuator. Hence, after dissolving the filler resist and replacing it by a high-temperature resin as previously, each electrode of a group is insulated from the collector of the other group of electrodes. Finally the actuator is completed by depositing the layers of conductive paint which constitute the terminal electrodes on the collector sides.

EXAMPLE 4

Using the technique disclosed in Example 3, plastic piezoelectric square sheets (30×30 mm×250 μm) were cut from a tape-cast band obtained from a slurry of the following ingredients.

| PZT 5H piezoceramic powder (Vernitron Ltd.) | 70 g |
| Graphite powder No. 1004 (Carbone Lorraine) | 30 g |
| Polyvinylbutyral binder | 16 g |
| Polyethylene glycol plasticizer | 5 g |
| Dioctylphthalate plasticizer | 3 g |
| Triethyl-phosphate deflocculant | 1 g |
| Mixture of trichloroethylene and ethanol (1:1) solvent | 85 g |

The mixture of the above ingredients was milled for 24 hrs with Zirconia balls before use.

Other 30×30 square sheets in the same plastic state were obtained identically from slurry (A) disclosed in Example 1.

A stack was made by piling the foregoing squares upon each other, starting with a pure ceramic tile and, thereafter using in alternate succession a graphite containing tile and a pure ceramic containing tile. The stack was thereafter pressed, burned and sintered for volatilizing the graphite and effect compaction. During pressing, the plastic piezoceramic material of the pure ceramic layers became intimately bound to the ceramic grains of the graphite containing layers, thus effecting monolithic compaction. Then, the porosity made available by the decomposition of the graphite component was infiltrated with molten silver/lead alloy as in Example 3. The consolidated laminate was finally cut into individual actuator stacks of about 5 mm square cross-section. Grooves for alternately terminating the electrode layers were accurately machined with a thin blade saw and filled with a resilient polyimide resin, this being for providing electrode ends insulated alternatingly on oposite sides of the stack; then the actuator structure was terminated as described in the previous examples.

EXAMPLE 5

The same procedure as that of Example 1 was used but the refractory metal powder in slurry (C) was replaced by 40% by weight of carbon powder. Then the printing, stacking, pressing and sintering operations were performed as in Example 1 to provide a compacted laminated block which was sawed transversally to actuator size (see FIGS. 2A, 2B, 3 and 4). The staggered grooves 55 on the cut blocks were filled with high temperature polyimide resin and the residual porosity was infiltrated as disclosed in Example 2 with a tin/lead/silver alloy molten at 240° C. After cooling the actuator was completed as in Example 2.

EXAMPLE 6

The embodiment of this Example resembles that of Example 1 with the following differences: first, 30×30 mm piezoceramic leaves were made with slurry (A) according to Example 1. Then a slurry similar to (C) was made in which the piezoceramic powder was entirely replaced by the 30/70 Ag/Pd powder. This slurry was used to print silk-screened electroconductive patterns on the pastic piezoceramic leaves. These patterns were made of 5 μm thick deposit comprising holes of about 200 μm diameter spaced by about 400 μm from each other. Fugitive stripes were also printed with slurry (B) like in Example 1.

The printed leaves were thereafter stacked and hot-pressed into a monolithic block whereby the ceramic flowed into the holes for effecting reinforcement of the structure. The latter was thereafter sintered and cut to actuator format as usual. The grooves were filled with resin and the cut blocks were thereafter terminated into functional actuators as disclosed in Example 1.

I claim:

1. A method of manufacturing a multilayer piezoceramic actuator stack comprising the steps of:
    (a) forming leaves or tiles of piezoceramic in a plastic state by casting a layer of ceramic on a tape supporting a ceramic impregnated ribbon of wire or filament fabric, at least one edge of tape and ribbon being made flush together, laminating said ribbon and said tape cast ceramic layer together, drying said laminate, and cutting said laminate to thereby form said leaves or tiles;
    (b) forming electrode material in fugitive or permanent state to be interposed between said piezoceramic tiles, said electrode material being in a given pattern provided with boundary discontinuities to define electrode free regions between said tiles;
    (c) piling over each other a plurality of tiles and electrode material to thereby form a stack comprising, in alternating succession, even and odd-numbered electrodes interposed between piezoceramic layers, all even-numbered electrodes forming a first group, all odd-numbered electrodes forming another group, and said electrode pattern with boundary discontinuities of said electrodes of said first group being in reciprocal opposite configuration to said electrode pattern of said another group in a final actuator structure;
    (d) pressing said stacked leaves into a compact block to effect integral binding of said tiles within said stack;
    (e) firing to sinter said block and, when said electrode material is fugitive, volatilizing said fugitive electrode material thus providing voids in said ceramic in a form of said electrode pattern;
    (f) filling discontinuities to become electrode free regions with pressure resistive material and, when voids in said form of said electrode pattern are present, infiltrating said voids with molten metal to thereby form final electrodes having said pattern;
    (g) connecting said even-numbered electrodes to a common electric collector and said odd-numbered electrodes to another common collector electrode, said collector electrodes being applied over opposite sides of said stack block.

2. The method of claim 1, wherein said fabric is a metallic wire mesh, whereby said electrode material is permanent.

3. The method of claim 1, wherein said fabric comprises organic polymer monofilaments, whereby said polymer is volatilized during firing leaving a void pattern to be thereafter filled with metal by infiltration.

4. The method of claim 1, in which after steps (d) or (e) the compacted block is cut vertically, transversally to the stacked layers, to provide a plurality of actuator shaped blocks of cross-sectional area narrower than that of the original stack, each of said narrower blocks being thereafter terminated into actuator proper according to manufacturing steps (f) and (g).

5. The method of claim 4, in which the direction of cutting of the stacked block corresponds to two sets of parallel lines which intersect at right angle, the cross-sectional area of the narrower blocks of actuator format being square or retangular.

6. The method of claim 5, in which step (b) includes applying stripes of fugitive material on each piezoceramic leaf along the lines of one of said set of lines, the cutting of the compacted block and the burning of said fugitive material eventually resulting in the formation of grooves in staggered configuration on opposite sides of the narrower actuator formatted blocks, these grooves being thereafter filled with pressure resisting insulator material to effect individual insulation at the tip edge of each corresponding electrode layer of the actuator.

* * * * *